(12) United States Patent
Ghoshal

(10) Patent No.: US 6,595,004 B1
(45) Date of Patent: Jul. 22, 2003

(54) APPARATUS AND METHODS FOR PERFORMING SWITCHING IN MAGNETIC REFRIGERATION SYSTEMS USING THERMOELECTRIC SWITCHES

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/127,080

(22) Filed: Apr. 19, 2002

(51) Int. Cl.$^7$ .............................. F25B 21/00; F25D 7/00
(52) U.S. Cl. ............................................ 62/3.1; 62/335
(58) Field of Search .............................. 62/3.1, 3.7, 335

(56) References Cited

U.S. PATENT DOCUMENTS

| | | | | |
|---|---|---|---|---|
| 3,841,107 A | * | 10/1974 | Clark | 62/3.1 |
| 4,112,699 A | * | 9/1978 | Hudson et al. | 62/3.1 |
| 4,205,293 A | * | 5/1980 | Melton et al. | 337/140 |
| 4,408,463 A | * | 10/1983 | Barclay | 62/3.1 |
| 4,507,928 A | * | 4/1985 | Johnson | 62/3.1 |
| 4,727,722 A | * | 3/1988 | Kirol | 62/3.1 |
| 4,916,907 A | * | 4/1990 | Munk et al. | 62/3.1 |
| 5,393,350 A | * | 2/1995 | Schroeder | 136/205 |
| 5,934,078 A | * | 8/1999 | Lawton et al. | 62/3.1 |
| 6,446,441 B1 | * | 9/2002 | Dean | 62/3.1 |

OTHER PUBLICATIONS

Gschneider, Jr., et al., "Work Begins on Prototype Magnetic–Refrigeration Unit", http://www.ameslab.gov/News/release/crada.html, Mar. 28, 2002, pp. 1–2.

Weiss, "Magnetic Refrigerator Gets Down and Homey", http://www.sciencenews.org/20020105/fob2.asp, Mar. 28, 2002, pp. 1–3.
AUS920020078US1, Ghoshal, Apparatus and Methods for Performing Switching in Magnetic Refrigeration Systems.
AUS920020257US1, Ghoshal, Apparatus and Methods for Performing Switching in Magnetic Refrigeration Systems Using Inductively Coupled Thermoelectric Switches.

* cited by examiner

Primary Examiner—William C. Doerrler
(74) Attorney, Agent, or Firm—Duke W. Yee; Casimer K. Salys; Stephen J. Walder, Jr.

(57) ABSTRACT

Apparatus and methods for performing switching of heat flow in magnetic refrigeration systems are provided. In one embodiment, microelectromechanical (MEM) switches are provided for switching from a heat absorption phase and a heat rejection phase of a magnetic refrigeration cycle. In other embodiments, these MEM switches are replaced by thermoelectric switches. The thermoelectric switches operate such that an "on" state is defined as heat flow being allowed by virtue of the thermal conductivity of the thermoelectric switch. An "off" state is defined as a net zero heat flow through the thermoelectric switch obtained by providing a current that is just sufficient to offset the heat flow through the thermoelectric switch due to its thermal conductivity. In some embodiments, the thermoelectric switches are "directly coupled" thermoelectric switches, meaning that they are energized by a direct electrical coupling to a current source. In other embodiments, one or more of the thermoelectric switches are "inductively coupled" thermoelectric switches, meaning that they are energized indirectly by a magnetic coupling. The magnetic refrigeration system may be cascaded or paralleled to provide greater cooling.

47 Claims, 7 Drawing Sheets

APPARATUS AND METHODS FOR PERFORMING SWITCHING IN MAGNETIC REFRIGERATION SYSTEMS USING THERMOELECTRIC SWITCHES

RELATED APPLICATIONS

This application is related to co-pending and commonly assigned U.S. patent application Ser. No. 10/127,067 entitled "Apparatus and Methods for Performing Switching in Magnetic Refrigeration Systems," and U.S. patent application Ser. No. 10/127,063 entitled "Apparatus and Methods for Performing Switching in Magnetic Refrigeration Systems Using Inductively Coupled Thermoelectric Switches," both filed concurrently herewith and incorporated herein by reference.

BACKGROUND OF THE INVENTION

1. Technical Field

The present invention is generally directed to electromagnetic refrigeration systems. More specifically, the present invention is directed to apparatus and methods for performing switching of heat flow in electromagnetic refrigeration systems.

2. Description of Related Art

Recent developments in magnetocaloric materials have suggested that magnetic refrigerators with high thermodynamic efficiency may be practical at room temperature. Magnetic refrigeration is based on the magnetocaloric effect, i.e. the ability of some materials to heat up when magnetized and cool when removed from the magnetic field. The use of magnetocaloric materials provides a relatively safe and environmentally friendly alternative to the chlorofluorocarbons and hydrochlorofluorocarbons used in traditional vapor-cycle cooling systems.

FIG. 1 is an exemplary diagram illustrating the magnetic refrigeration cycles of an adiabatic magnetic refrigerator system. As shown in FIG. 1, refrigeration starts, in a first phase of the cycle, with the placement of a magnetocaloric material 110 within the magnetic field of a magnet 120. As the magnetocaloric material 110 enters the magnetic field, the electron spin of the atoms of the magnetocaloric material 110 align thereby causing the material to heat up.

In a second phase of the cycle, a cool fluid 130 is pumped into the system to absorb the heat from the magnetocaloric material 110. Thus, cool fluid 130 is pumped into the system and hot fluid 140 is pumped out of the system. In this way, heat is rejected from the magnetocaloric material 110 due to cooling from the cool fluid 130.

In a third phase of the cycle, the magnetocaloric material 110 is removed from the magnetic field. This causes the electron spin of the atoms of the magnetocaloric material 110 to randomize which increases entropy and draws heat from the lattice of the magnetocaloric material 110. By drawing heat from the lattice of the magnetocaloric material 110 in an adiabatic setting, the magnetocaloric material 110 cools.

In the last phase of the cycle, fluid 150 is pumped into the system. Heat from the fluid 150 is absorbed by the atoms of the magnetocaloric material 110 thereby reducing the temperature of the fluid 150. As a result, cold fluid 160 is pumped out of the system.

Systems for implementing the magnetic refrigeration cycle described above are mechanically complex. For example, in "Magnetic Refrigerator Gets Down and Homey," Science News Online, Vol. 161, No. 1, Jan. 5, 2002, which is hereby incorporated by reference, a magnetic refrigeration system using a rotating ring is described.

In this system, the permanent magnets are stationary and a magnetic ring use used to move a gadolinium powder, stuffed into pockets of the ring, in and out of magnetic fields generated by the permanent magnets. A fluid is pumped into and out of the system to carry heat away and to provide a cooling fluid for refrigeration. The system requires a complex mechanical drive for rotating the ring, pumping the heat-conducting fluids in and out of the system, complex fluid sealing, and synchronizing the movements of the heat-conducting fluids through portions of the rotating ring.

Thus, as described above, these known magnetic refrigerator systems need moving parts and/or advanced fluid flow to absorb or reject heat from the magnetocaloric material. In principle, similar constraints bound the possibility of using electrocaloric (pyroelectric) materials. Furthermore, since magnetocaloric materials undergo very small temperature changes with each magnetic field cycle, e.g., 3 degrees Kelvin per Tesla of magnetic field, around room temperature systems need to be cascaded to realize refrigerators which provide cooling at useful temperature differentials, e.g., 20–30 degrees Kelvin. The complexity of fluidic schemes and the moving parts reduce the efficiency of cascaded coolers and reduce the reliability significantly. Moving parts and advanced fluid flow systems increase the cost of magnetic refrigerators and provide additional sources of failure.

Thus, it would be beneficial to reduce or eliminate moving parts and fluid flows in magnetic refrigerator systems in order to provide simpler and more reliable mechanisms that can be more readily cascaded or paralleled to provide sufficient cooling and temperature differential for practical use. Moreover, it would be beneficial to provide miniature and solid state mechanisms for controlling the switching of the heat flow to and from the magnetocaloric material in magnetic refrigeration systems.

SUMMARY OF THE INVENTION

The present invention provides an apparatus and methods for performing switching of heat flow in magnetic refrigeration systems. In one embodiment of the present invention microelectromechanical (MEM) switches are provided for switching from a heat absorption phase and a heat rejection phase of a magnetic refrigeration cycle. With this embodiment, when a magnetocaloric material is subjected to a magnetic field, the magnetocaloric material generates heat. At this time, a first MEM switch between a heat source (cold end) and the magnetocaloric material is placed in an "off" state. A second MEM switch between the magnetocaloric material and a heat sink (hot end) is placed in an "on" state so that heat from the magnetocaloric material flows to the heat sink.

When the magnetic field is removed, the magnetocaloric material cools. The first MEM switch is placed in an "on" state and the second MEM switch is placed in an "off" state. Thus, heat flows, or is absorbed, from the heat source to the magnetocaloric material.

Similar operation is performed in other embodiments of the present invention in which the MEM switches are replaced by thermoelectric switches. The thermoelectric switches operate such that an "on" state is defined as the state enabling heat flow by virtue of the thermal conductivity through the thermoelectric switch. An "off" state is defined as a net zero heat flow through the thermoelectric switch. The "off" state is accomplished by providing a thermoelectric cooling effect current that is just sufficient to offset the heat flow through the thermoelectric switch due to the thermal conductivity of the thermoelectric switch.

Various arrangements of the thermoelectric switches are possible. In some embodiments, the thermoelectric switches are "directly coupled" thermoelectric switches, meaning that they are energized by a direct electrical coupling to a current source. In other embodiments, one or more of the thermoelectric switches are "inductively coupled" thermoelectric switches, meaning that they are energized indirectly by a magnetic coupling.

The magnetic refrigeration system of the present invention may be cascaded or paralleled to provide greater cooling temperature or capacity. In one embodiment, the cascading involves a plurality of magnetic refrigeration systems staged such that they each share at least one thermal sink/source with another magnetic refrigeration system. In another embodiment, the magnetic refrigeration systems may be staged such that the magnetocaloric material of a next stage acts as a hot end of the previous stage. The cascaded magnetic refrigeration systems may be arranged in a stacked manner, parallel manner, or the like.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

The present invention provides a mechanism for performing switching of heat flow in magnetic refrigeration systems such that the need for complex mechanical and fluidic systems, typical of known magnetic refrigeration systems, is reduced. With the present invention, switches are provided for switching the thermal path between the heat absorption and heat rejection locations during related phases of the magnetic refrigeration cycle. In this way, the mechanical elements of the magnetic refrigeration system are appreciably reduced, thereby increasing the reliability of the system. In addition, the mechanisms of the present invention allow for easier cascading of magnetic refrigeration apparatus in order to provide refrigerators with useful temperature differentials.

Figure 1:
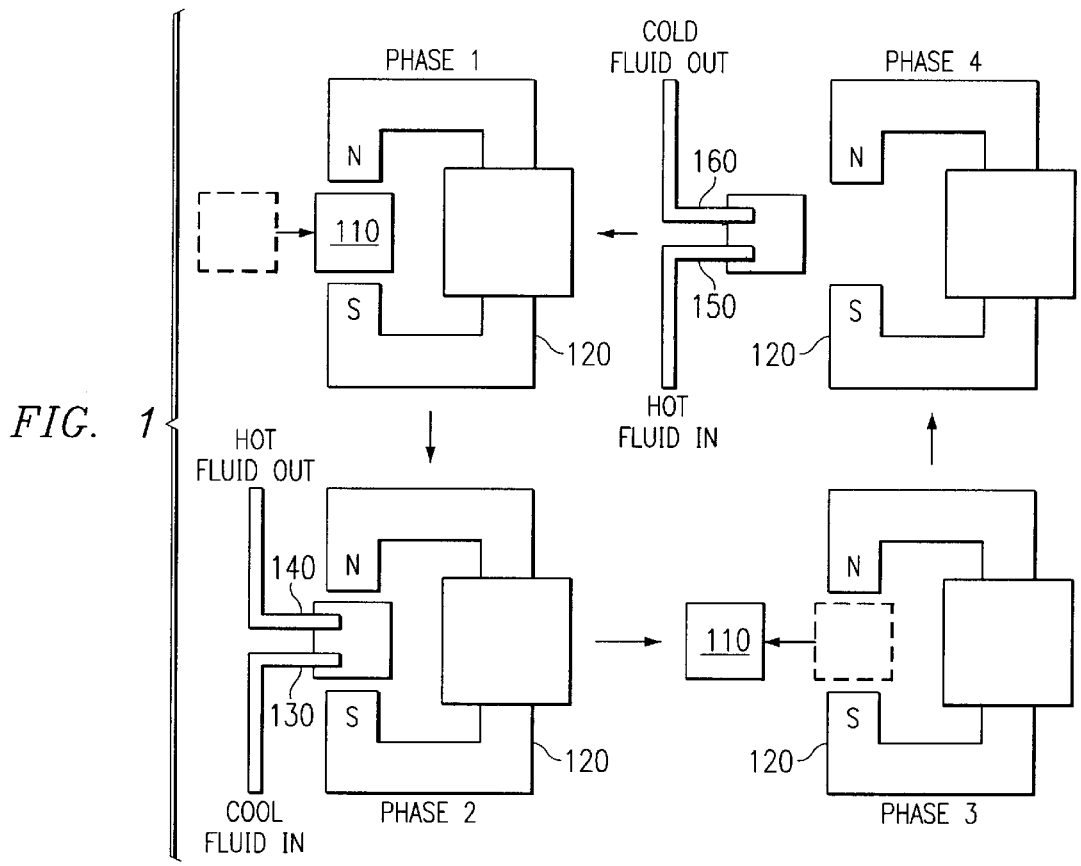
FIG. 1 is an exemplary diagram of the operating cycle of a magnetic refrigeration system.
Figure 2:
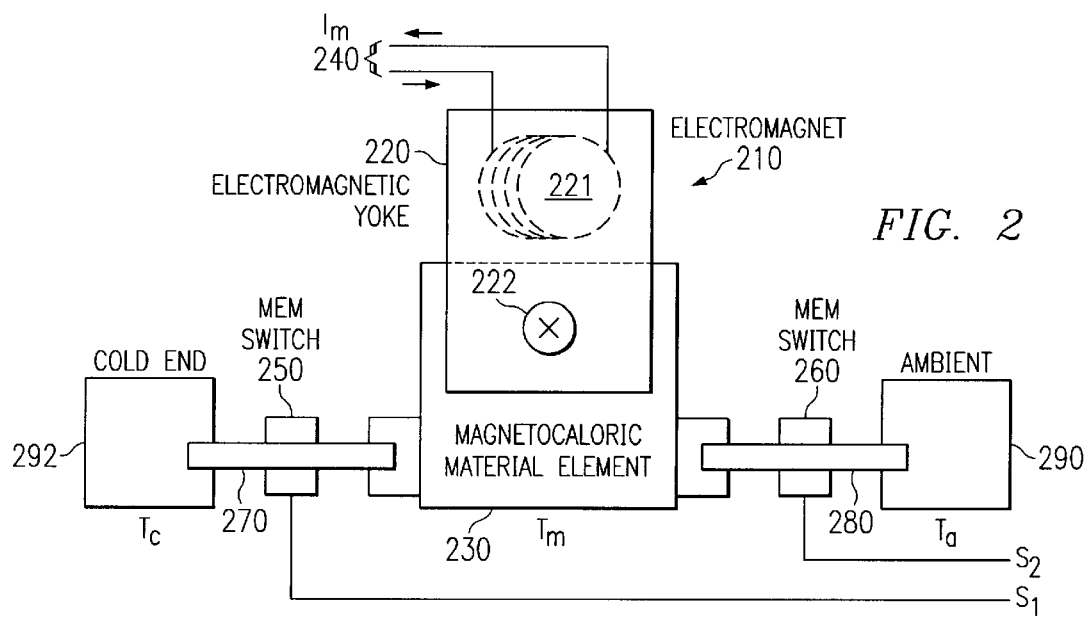
FIG. 2 is an exemplary diagram of a microelectromechanical switch based magnetic refrigeration system in accordance with one embodiment of the present invention.

FIG. 2 is an exemplary diagram illustrating a top-down perspective of a first embodiment of the present invention in which microelectromechanical switches (MEMS) are utilized. As shown in FIG. 2, the electromagnet 210 is coupled to an electromagnetic yoke 220 which has a coil 221 used to generate a magnetic field. When an electric current is passed through the coil 221 via the leads 240, a magnetic field 222 is generated in the electromagnet 210.

Heat flow switches 250 and 260 are provided for switching a thermal path between elements 292, 290, and 230. The heat flow switches 250 and 260 cause the thermal conduction elements 270 and 280, e.g., thermally conductive cantilever arms, to engage or not engage and thereby selectively enable or disable the thermal path between 292, 290 and 230. The heat flow switches 250 and 260 may be, for example, microelectromechanical switches, microrelays, reed switches, gate switches, and the like, that operate to allow or restrict heat flow through the thermal paths created by the thermal conduction elements 270 and 280.

When a current $I_m$ is passed through the leads 240, and thus, the coil 221, the electromagnet 210 generates a magnetic field 222. The magnetic field, in turn, causes the electron spins of the atoms in the magnetocaloric material element 230 to align. As a result, the magnetocaloric material element 230 heats up.

During this stage of the magnetic refrigeration cycle, the temperature of the magnetocaloric material $T_m$ is greater than the thermal sink at ambient temperature $T_a$. A control signal $S_2$ is supplied, from a control system (not shown) such as a computerized controller or the like, to the heat flow switch 260 causing it to operate and connect the thermal conduction element 280. This allows heat flow through the thermal path created by the thermal conduction element 280 from the magnetocaloric material element 230 to the ambient 290 to thereby reject heat into the ambient 290 and bring the temperature of the magnetocaloric material element 230 substantially to equilibrium with the ambient 290. Although the temperature of the magnetocaloric material element 230 and the ambient 290 are brought to equilibrium, the electron spins of the atoms of the magnetocaloric material element 230 still remain aligned due to the continued presence of the magnetic field.

At some time later, the current $I_m$ to the coil 221 of the electromagnet 210 is discontinued and thus, the magnetic field 222 is removed from the magnetocaloric material element 230. Upon removal of the magnetic field, the electron spins of the atoms of the magnetocaloric material element 230 randomize and the magnetocaloric material element cools down as a result.

A control signal $S_2$ is sent to the heat flow switch 260 causing it to open the thermal path created by the thermal conduction element 280 and thus, there is no heat flow path from the magnetocaloric material element 230 to the ambient 290. A control signal $S_1$ is provided to heat flow switch 250 causing it to close the thermal path created by the thermal conduction element 270 and thus, heat is allowed to flow from the cold end 292 to the magnetocaloric material element 230 since the cold end 292 is initially at a temperature greater than the magnetocaloric material element 230. As a result, the temperature of the cold end $T_c$ brought towards equilibrium with the temperature of the magnetocaloric material element $T_m$.

It should be appreciated that the heat flow switches, e.g., microrelays, have high reliability on the order of $10^9$ switching events. Assuming that there is a single switching event per second, this reliability provides a mean time between failures of approximately 10 years. Redundancy of the heat flow switches may be built into the system to provide even greater mean times between failures.

It has been determined that the cooling capacity of the magnetic refrigeration system is related to the switching rate of the heat flow switches. Thus, with higher switching rates a larger amount of cooling is possible. However, higher switching rates also generally means a lower mean time between failure. Thus, depending on the particular application of the present invention, various switching rates may be utilized. The control system (not shown) may be programmed to provide various switching rates depending upon the particular application.

In addition, the heat flow switches have simple moving structures allowing for easy cascading of the system. Easy cascading allows for increased cooling at each stage of the cascaded system. Given that each stage is capable of providing a nominal 3–4 Kelvin temperature differential, appreciable cooling on the order of 20–30 Kelvin may be achieved with a relatively simple cascaded structure.

Thus, the present invention provides a simple mechanical device for switching heat flow from a heat absorption and heat rejection phase with respect to the magnetocaloric material. As far as control operations are concerned, a simple synchronizing of the switching of the heat flow switches with the generation of the magnetic field is all that is necessary to provide a reliable magnetic refrigeration system according to the present invention. Thus, a less complex and more reliable electromagnetic refrigeration system than the known magnetic refrigeration systems is provided.

In the above embodiment, a mechanical device, e.g., a microelectromechanical switch, is utilized to perform the switching between heat absorption and heat rejection phases of the magnetic refrigeration cycle. Even though the above mechanism represents a vast improvement over known magnetic refrigeration systems, such mechanical devices still represent a source of potential failure of the magnetic refrigeration system. For example, mechanical devices are susceptible to stiction, oxide formation, fatigue, condensation, and many other factors that may cause them to not operate properly. It would therefore be beneficial to use a non-mechanical mechanism for switching between the heat absorption and heat rejection phases of the magnetic refrigeration cycle and thereby further reduce the possible sources of failure.

In the following embodiments of the present invention, the mechanical heat flow switches of the previously described embodiment are replaced with thermoelectric switches. These thermoelectric switches do not include any moving parts and therefore, are more reliable than the mechanical heat flow switches utilized above.

Figure 3:
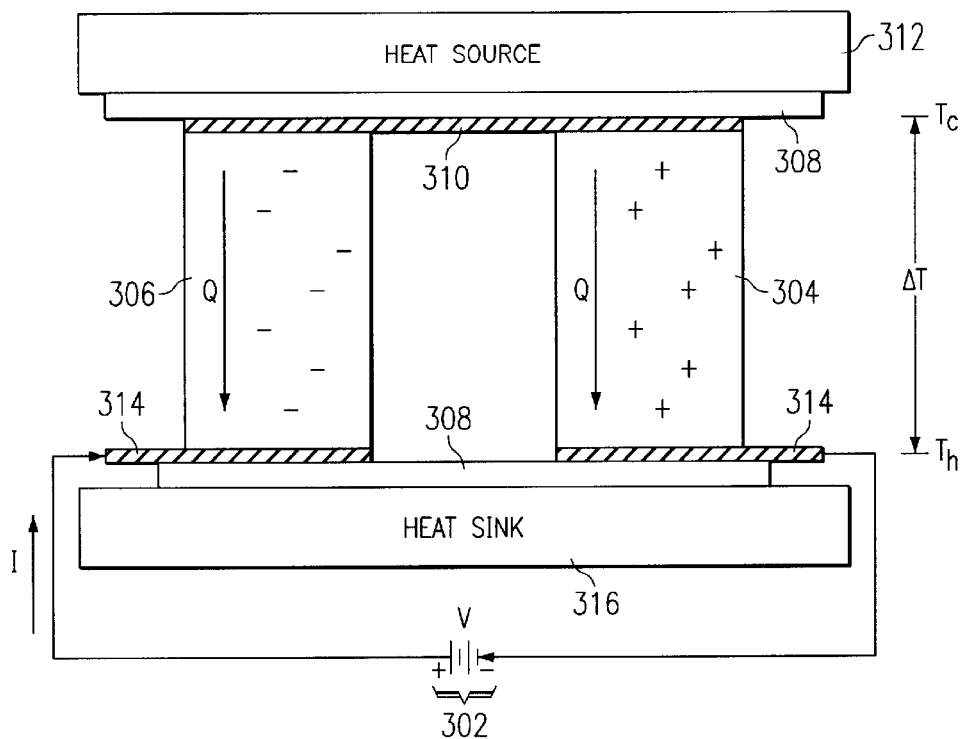
FIG. 3 is an exemplary diagram illustrating a thermoelectric switch in accordance with one embodiment of the present invention.

FIG. 3 is an exemplary diagram of a thermoelectric cooling element in accordance with the present invention. The thermoelectric cooling element of FIG. 3, according to the present invention, is operated so as to act as a heat flow switch, i.e. either enabling or disabling a thermal path through which heat flows from a thermal source to a thermal sink. Hereafter, the operation of a thermoelectric cooling element will first be explained and then the specific operation of the thermoelectric cooling element as a heat flow switch, in accordance with the present invention, will be described.

Thermoelectric cooling, a well known principle, is based on the Peltier Effect, by which DC current from power source 302 is applied across two dissimilar materials causing heat to be absorbed at the junction of the two dissimilar materials. A typical thermoelectric cooling device utilizes p-type semiconductor 304 and n-type semiconductor 306 sandwiched between poor electrical conductors 308 that have good heat conducting properties. Semiconductors 304 and 306 are thermally conductive. N-type semiconductor 306 has an excess of electrons, while p-type semiconductor 304 has a deficit of electrons. Electrical conductors 310 and 314 are also good thermal conductors.

As electrons move from electrical conductor 310 to n-type semiconductor 306, the energy state of the electrons is raised due to heat energy absorbed from heat source 312. This process has the effect of transferring heat energy from heat source 312 via electron flow through n-type semiconductor 306 and electrical conductor 314 to heat sink 316. The electrons drop to a lower energy state and release the heat energy in electrical conductor 314. The complementary effect occurs with reference to p-type semiconductor 304.

The coefficient of performance, $\eta$, of a cooling refrigerator, such as thermoelectric cooler 300, is the ratio of the cooling capacity of the refrigerator divided by the total power consumption of the refrigerator. Thus the coefficient of performance is given by the equation:

$$\eta = \frac{\alpha I T_c - \frac{1}{2} I^2 R - K \Delta T}{I^2 R + \alpha I \Delta T}$$

where $\alpha$ is the Seebeck coefficient for the material, $T_c$ is the temperature of the heat source, $\Delta T$ is the difference in the temperature of the heat source form the temperature of the heat sink, R is electrical resistance, K is thermal conductance, and I is the current. The term $\alpha I T_c$ is due to the thermoelectric cooling, the term $\frac{1}{2}I^2 R$ is due to Joule heating backflow, the term $K\Delta T$ is due to thermal conduction, the term $I^2R$ is due to Joule loss, and the term $\alpha I\Delta T$ is due to work done against the Peltier voltage.

The maximum coefficient of performance is derived by optimizing the current I, and is given by the following relation:

$$\eta_{max} = \left(\frac{T_c}{\Delta T}\right)\left[\frac{\gamma - \frac{T_h}{T_c}}{\gamma + 1}\right] \text{ where } \gamma = \sqrt{1 + \frac{\alpha^2\sigma}{\lambda}\left(\frac{T_h + T_c}{2}\right)} \text{ and}$$

$$\varepsilon = \frac{\gamma - \frac{T_h}{T_c}}{\gamma + 1}$$

where $\varepsilon$ is the efficiency factor of the cooling device. The figure of merit, ZT, is given by the equation:

$$ZT = \frac{\alpha^2\sigma T}{\lambda}$$

where $\lambda$ is the thermal conductivity.

In order to use the thermoelectric cooler as a heat flow switch, two states are defined. The first state, i.e. an "on" state, is accomplished by allowing heat to flow from the heat source to the heat sink. That is, left alone with no current input, the thermoelectric material will have a heat flow that flows from the heat source to the heat sink by virtue of the thermal conductivity of the thermoelectric material and the temperature difference between the heat source and the heat sink. In other words when the current I is zero, the heat flow, Q, through the thermoelectric material of the heat switch is $Q=-K\Delta T$.

A second state, i.e. an "off" state, is defined such that there is zero heat flow through the thermoelectric material. That is, a current is passed through the thermoelectric cooler that is only large enough to offset the thermal conductivity of the thermoelectric material. From the above relations, the following equations for current I, voltage V, and power P for zero heat flow may be obtained:

$I=(K/\alpha)(\Delta T/T_c)$ $V=\alpha\Delta T(1+1/ZT_c)$ $P=VI=K\Delta T(\Delta T/T_c)(1+1/ZT_c)$ Thus, from the above relations it is clear that when the difference in temperatures $\Delta T$ between the heat source and the heat sink is small, the amount of power necessary to cancel the heat flow, i.e. obtain zero heat flow, is small.

Therefore, thermoelectric material heat flow switches having on and off states, as defined above, may be utilized in place of the mechanical heat flow switches of the previously described embodiment. With such thermoelectric switches, a current may be applied to the thermoelectric switch that is only sufficient to offset the thermal conductivity heat flow through the thermoelectric material of the switch. The heat flow is enabled by not supplying a current to the thermoelectric switch.

Figure 4:
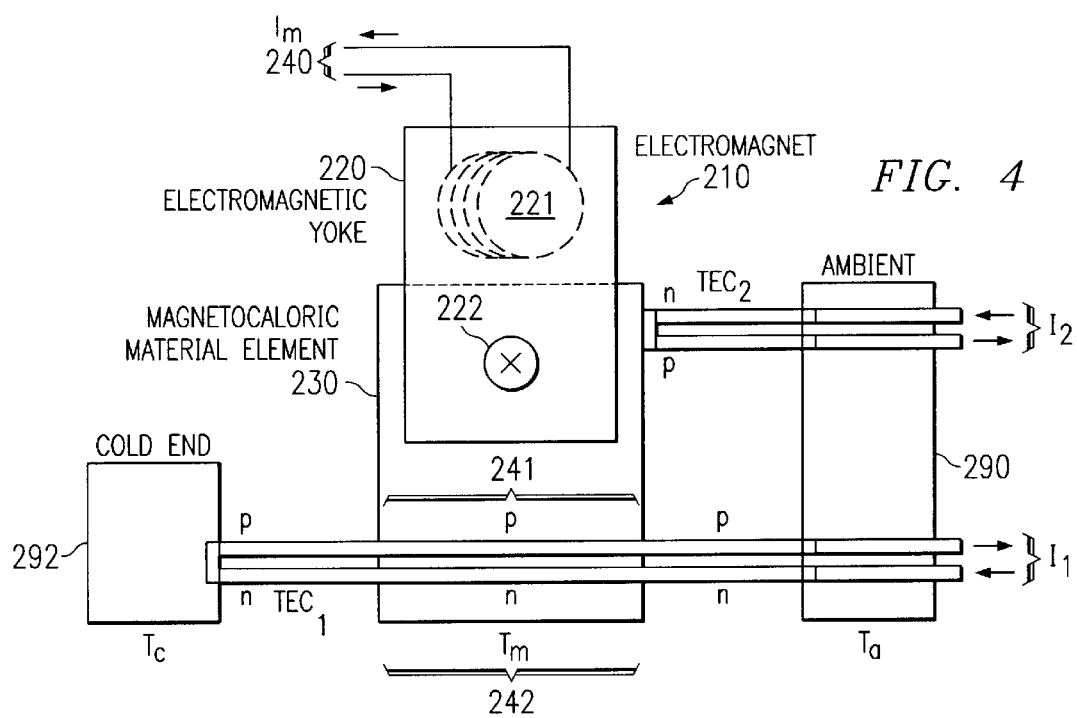
FIG. 4 is an exemplary diagram illustrating one embodiment of a thermoelectric switch based magnetic refrigeration system.

FIG. 4 is an exemplary diagram of an embodiment of the present invention in which thermoelectric switches are utilized to control the thermal path switching between heat absorption and heat rejection phases of a magnetic refrigeration cycle. As with the prior embodiments described above, the electromagnet 210 generates a magnetic field 222 that heats up the magnetocaloric material element 230.

During this phase of the magnetic refrigeration cycle, current $I_1$ is supplied to the first thermoelectric switch $TEC_1$ via electrical leads at the ambient 290 end. The first thermoelectric switch leads are preferably the p and n type legs from the cold end 292 through the magnetocaloric material element 230 to the ambient 290. This configuration is used because of the need to supply current to the thermoelectric switch $TEC_1$, via direct wiring connections. Unfortunately, the need for such leads introduces a thermal path between magnetocaloric material element 230 and ambient temperatures heat sink 290. If electrical wires were used for spans 241 and 242 over the magnetocaloric material element 230, the current $I_1$ passing through the loop would create a second pair of thermoelectric elements at ends of the electric wire over the magnetocaloric material element 230. The current $I_1$ is sufficient to cause zero heat flow in the thermoelectric switch $TEC_1$. Thus, during this phase of the magnetic refrigeration cycle, namely when $TEC_2$ is not energized ($I_2=0$), heat flows from the magnetocaloric material 230 to the ambient 290 through both the thermoelectric switch $TEC_2$ and the extending p and n leads of $TEC_1$.

During the next phase of the magnetic refrigeration cycle, the electromagnet 210 the magnetic field 222, is removed. Current $I_2$ is supplied to the thermoelectric switch $TEC_2$ and current $I_1$ is discontinued. As a result, heat flows from the cold end 292 to the magnetocaloric material element 230.

However, there exists undesirable heat flow from the ambient 290 to the magnetocaloric material element 230 through the p and n leads of $TEC_1$. To offset this undesirable heat flow, the current $I_2$ must be at least twice the current $I_1$ to compensate for the thermal conductivity of both $TEC_2$ and the p and n leads of $TEC_1$. Thus, with the present invention, switching between the heat absorption phase and heat rejection phase may be performed in a magnetic refrigeration system without the need for complex mechanical devices. Simply by providing electrical currents to the thermoelectric t switches, the heat flow between the magnetocaloric material element and the ambient and cold ends may be controlled.

Even though providing thermoelectric switches in the configuration discussed above, provides a much more reliable magnetic refrigeration system than the known magnetic refrigeration systems, there are still some drawbacks to the above embodiment. Because the current $I_2$ must be large enough to compensate for the thermal conductivity of thermoelectric switches $TEC_2$ and the p and n leads of $TEC_1$, large losses due to Joule heating are introduced. It would therefore, be beneficial to increase the efficiency of the above embodiment.

Figure 5:
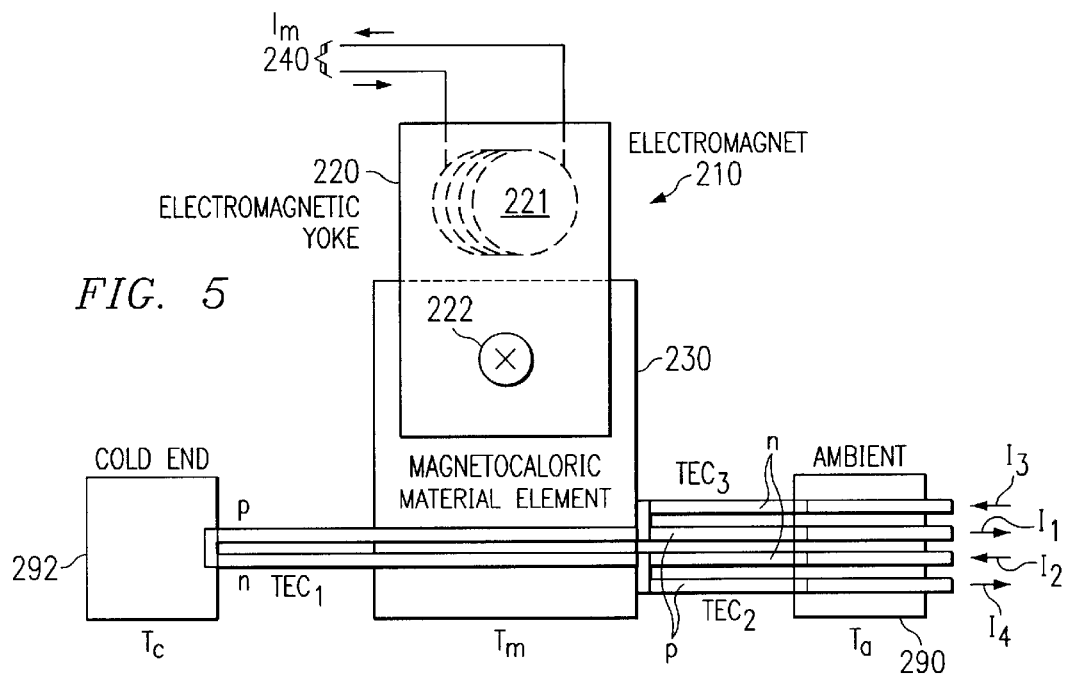
FIG. 5 is an exemplary diagram illustrating a second embodiment of a thermoelectric switch based magnetic refrigeration system.

FIG. 5 is an exemplary diagram of an alternative embodiment of the thermoelectric switch operated magnetic refrigeration system of FIG. 4. As shown in FIG. 5, the p side of the thermoelectric switch $TEC_1$ is coupled to the thermoelectric switch $TEC_3$ and the n side of the thermoelectric switch $TEC_1$ is coupled to the thermoelectric switch $TEC_2$. In this way, by passing selected currents $I_1$–$I_4$ through the thermoelectric switches the flow from the magnetocaloric material element 230 to the ambient 290 and from the cold end 292 to the magnetocaloric material element may be accomplished more efficiently than through the use of the separate compensation configuration in FIG. 4.

For example, during magnetization of the magnetocaloric material element 230, it is necessary to block the heat flow from the magnetocaloric material element 230 to the cold end 292. In order to provide such blocking of heat flow, the following currents are supplied to the legs of the thermoelectric switches $TEC_2$ and $TEC_3$:

$I_1=I_2=(K/\alpha)(\Delta T/T_a)$ and $I_3=I_4=0$

As a result, current flows through the thermoelectric switch $TEC_1$ to block or offset the conductivity heat flow through the thermoelectric switch. Heat flows from the magnetocaloric material element 230 to the ambient sink 290 by conductivity via the thermoelectric t switches $TEC_2$ and $TEC_3$.

Following demagnetization, the heat flow through thermoelectric switches $TEC_2$ and $TEC_3$ needs to be blocked. To block these heat flows, the following currents are applied to the legs of the thermoelectric switches $TEC_2$ and $TEC_3$:

$$I_1=I_3=I_2=I_4=(K/\Delta T/T_a)$$

Thus, current flows through the thermoelectric switches $TEC_2$ and $TEC_3$ to offset the thermal conduction through the switches and thereby cause a net zero heat flow through these switches. As a result, heat flows from the cold end 292 to colder magnetocaloric material element 230 by virtue of the thermal conductivity of the thermoelectric switch $TEC_1$.

With the embodiments shown in FIGS. 4 and 5, electrical current is passed through the thermoelectric switches via electrical leads (as depicted in FIG. 4). The number of electrical leads causes a problem when cascading the magnetic refrigeration system to provide cooling on the order of 20–30 Kelvin. To obtain 20–30 Kelvin, anywhere from 5 to 10 stages, or more, may be necessary. Since the number of leads and current sources grows exponentially with stages, cascading beyond a few stages is made difficult. Furthermore, as the number of electrical leads increases, the negative effects of conductivity and Joule heating makes cascading impractical. Thus, it would be beneficial to eliminate the need for these electrical leads in the embodiments of FIGS. 4 and 5.

Figure 6:
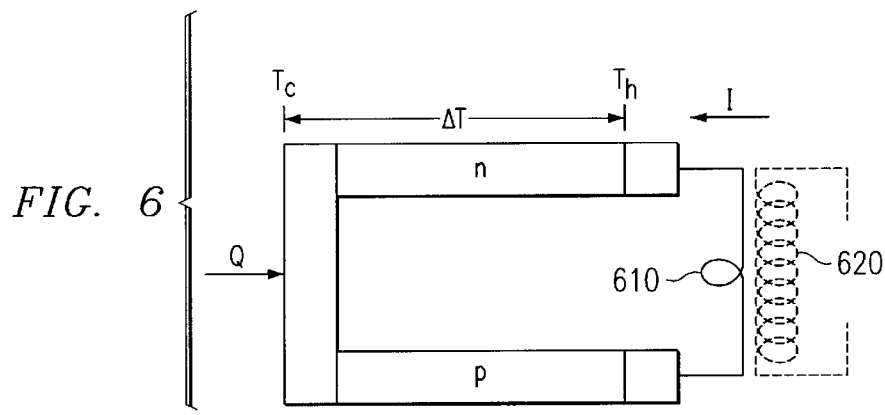
FIG. 6 is an exemplary diagram illustrating an inductively coupled thermoelectric switch in accordance with the present invention.

FIG. 6 illustrates an inductively coupled thermoelectric switch according to another embodiment of the present invention. The thermoelectric switch operates in much the same manner as described previously with the exception that current is not supplied over n and p leads from the thermoelectric switch. As a consequence, the inductively coupled thermoelectric switches are not subject to the thermal conductivity loss through the current supply leads.

As shown in FIG. 6, rather than having directly coupled electrical leads to the n and p elements of the thermoelectric switch, electrical coil 610 and 620 are provided. A current is passed through electrical coil 620 which causes a magnetic field to be generated in coil 620 and coupled into coil 610. The coil 610 is shown with fewer turns than coil 620. The single turn of coil 610 is provided so as to minimize the thermal capacitance of the coil 610 and thereby maximize the temperature differential exhibited by the magnetocaloric material element 230 which is thermally coupled to coil 610.

The magnetic field generated by coil 620 induces a magnetic field in the coil 610 and thus, an electrical current is generated in the coil 610 thereby causing a current to flow through the thermoelectric switch. As a result, the need for multiple leads from the thermoelectric switches to current sources is eliminated. In this way, the inductively coupled thermoelectric switch avoids the problems associated with the thermal conductivity of electrical leads because the power for the thermoelectric element is supplied via a magnetic field coupling.

Figure 7:
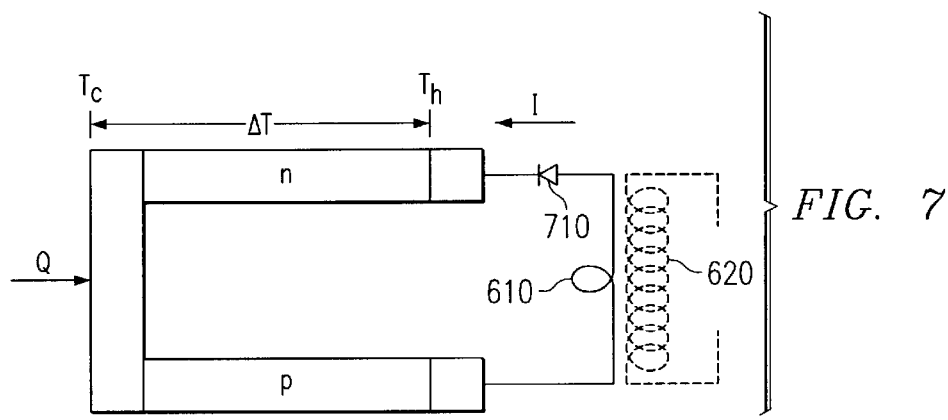
FIG. 7 is an exemplary diagram illustrating a diode-based inductively coupled thermoelectric switch in accordance with the present invention.
Figure 8A:
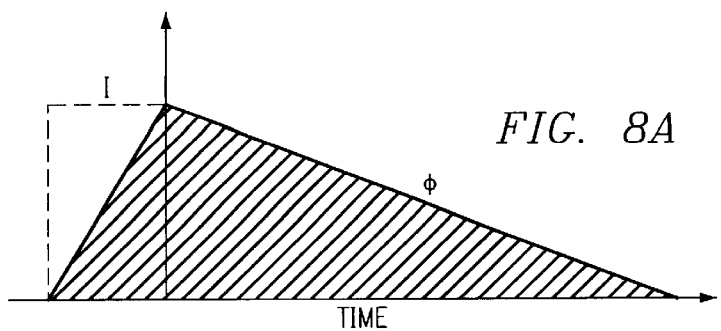
FIGS. 8A and 8B are graphs showing the decay rate of the current in the inductively coupled thermoelectric switch leads over time for a non-diode-based embodiment and a diode-based embodiment, respectively.
Figure 8B:
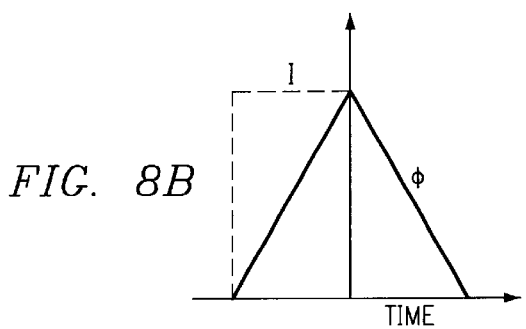

Because the current in the coil 610 is generated by the magnetic field generated of coil 620, the current in coil 620 is ramped quickly to improve coupling to coils 610. However, when disabling the thermoelectric device the rate of decay of the current in coil 620 must be slow so as to minimize the reverse current through coil 610, Example ramps are illustrated in FIG. 8A. To eliminate this difference in the timing of the phases of the magnetic refrigeration cycle, a mechanism may be provided in the leads of the coil 610 to control the direction of the current through thermoelectric switch. In the embodiment shown in FIG. 7, this mechanism is a diode 710 preferably with a very low-turn-on voltage. For example, the diode 710 may be a depletion FET type diode, large p-n junction type diode, or the like. During operation, the diode 710 acts as a one-way valve allowing current to flow in one direction but not the other way. As a result, matching rise and fall rates may be used in driving coil 620, as illustrated in FIG. 8B.

Thus, the directly coupled thermoelectric switches of the previous embodiments may be replaced with inductively coupled thermoelectric switches without departing from the spirit and scope of the present invention. In this way, the magnetic refrigeration system is made simpler for cascading because the number of leads required is maintained at a minimum. In addition, this inductive coupling allows for the same power source to operate a plurality of inductively coupled thermoelectric switches in the cascaded system.

The above embodiments of the present invention make use of electromagnets to which current is supplied in order to generate magnetic fields. Electromagnets are susceptible to Joule heating in the coil windings used to generate the magnetic field, which reduces the efficiency of the refrigeration system. Moreover, when the electromagnet is in close proximity to the magnetocaloric material, the magnetocaloric material is subject to heat radiating from the electromagnet. Thus, it would be desirable to eliminate these problems associated with electromagnets in the magnetic refrigeration system.

Figure 9:
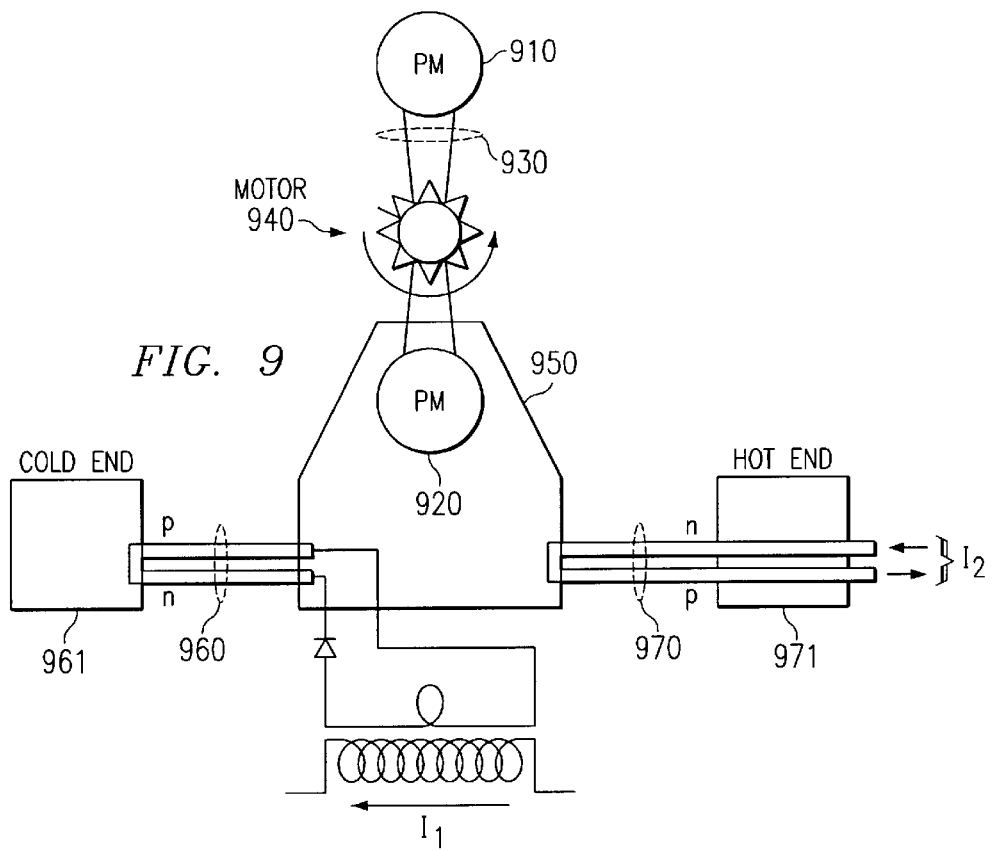
FIG. 9 is an exemplary diagram illustrating one embodiment of a magnetic refrigeration system in which a rotary permanent magnet is utilized.

FIG. 9 is an exemplary diagram illustrating a magnetic refrigeration system in accordance with another embodiment of the present invention in which permanent magnets and indirectly coupled thermoelectric switches are utilized. As shown in FIG. 9, permanent magnets 910 and 920 are attached to the end of a rotating support 930 which is rotated by a motor 940. Once the motor 940 is started, angular momentum may be used to keep the permanent magnets 910 and 920 rotating. The only power to the motor 940 that is required is the minimal amount of power needed to overcome friction of the motor 940, support 930 and magnets 910 and 920.

The permanent magnets 910 and 920 are rotated into and out of a position of functional proximity to the magnetocaloric material element 950. When the permanent magnet is within the vicinity of the magnetocaloric material element 950, the magnetic field generated by the permanent magnet causes the magnetocaloric material to heat up due to the alignment of the electron spins of the atoms in the magnetocaloric material, as discussed previously.

During this phase of the magnetic refrigeration cycle, a current $I_1$ is supplied to the coils of the inductively coupled thermoelectric switch 960. As a result, the thermoelectric switch 960 causes a net zero heat flow from magnetocaloric material element 950 while the zero $I_2$ current permits thermal conduction heat flow through thermoelectric element 970 to hot end 971.

When the permanent magnet 910, 920 is rotated away from the magnetocaloric material element 950, the removal of the magnetic field causes the magnetocaloric material element to cool. A current $I_2$ is supplied to the directly coupled thermoelectric switch 970 such that the net heat flow from hot end 971 through the directly coupled thermoelectric switch 970 is zero. The current $I_1$ to the coils of inductively coupled thermoelectric switch 960 is zero. As a result, heat is absorbed by the magnetocaloric material element 950 from the cold end 961 by thermal conduction through the thermoelectric switch 960.

Figure 10:
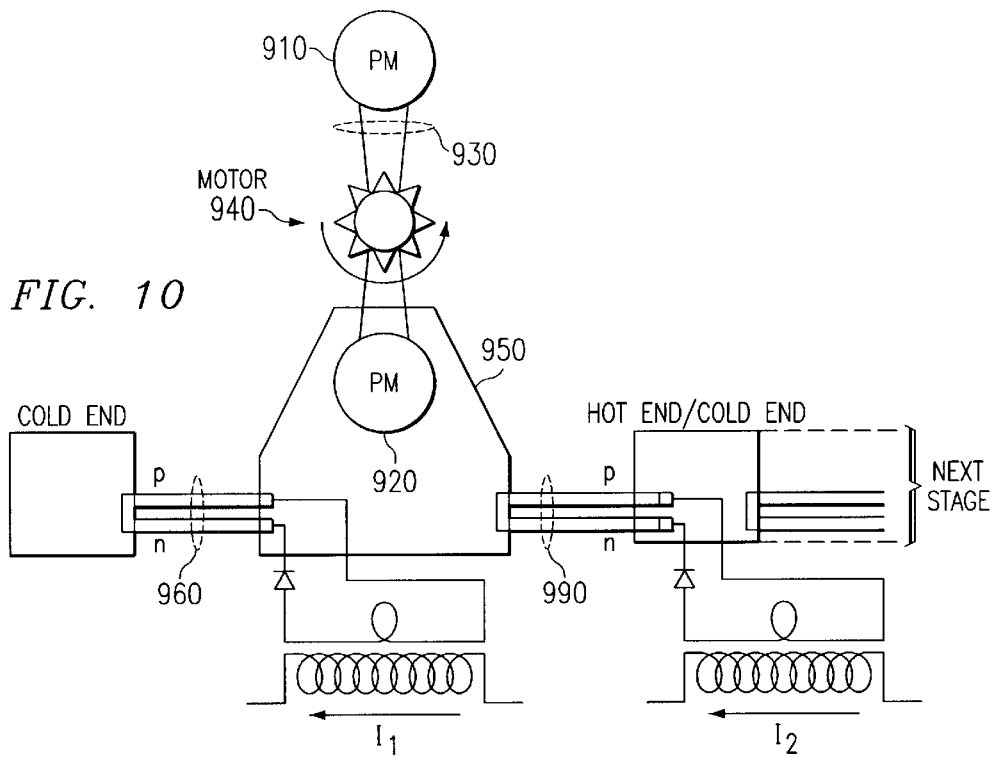
FIG. 10 is an exemplary diagram illustrating a second embodiment of a magnetic refrigeration system in which a rotary permanent magnet is utilized.

FIG. 10 is an illustration of a similar system to that of FIG. 9, having the directly coupled thermoelectric switch 970, being replaced by an inductively coupled thermoelectric switch 990. The magnetic refrigeration system of FIG. 10 operates in much the same manner as that of FIG. 9 with the exception that current is supplied to the coil of the thermoelectric switch 990 by magnetic coupling current $I_2$. As illustrated by phantom designation, the use of an inductively coupled thermoelectric switch 990 may be one of multiple cascaded stages in a multistage magnetic refrigeration system.

It should be appreciated that the use of the permanent magnets as described above is not limited to embodiments in which thermoelectric switches are utilized. Rather, the permanent magnet configuration described above may be used in combination with microelectromechanical switches as well. Thus, one or more of the thermoelectric switches depicted in FIGS. 9 and 10 may be replaced by a microelectromechanical switch without departing from the spirit and scope of the present invention.

Figure 11:
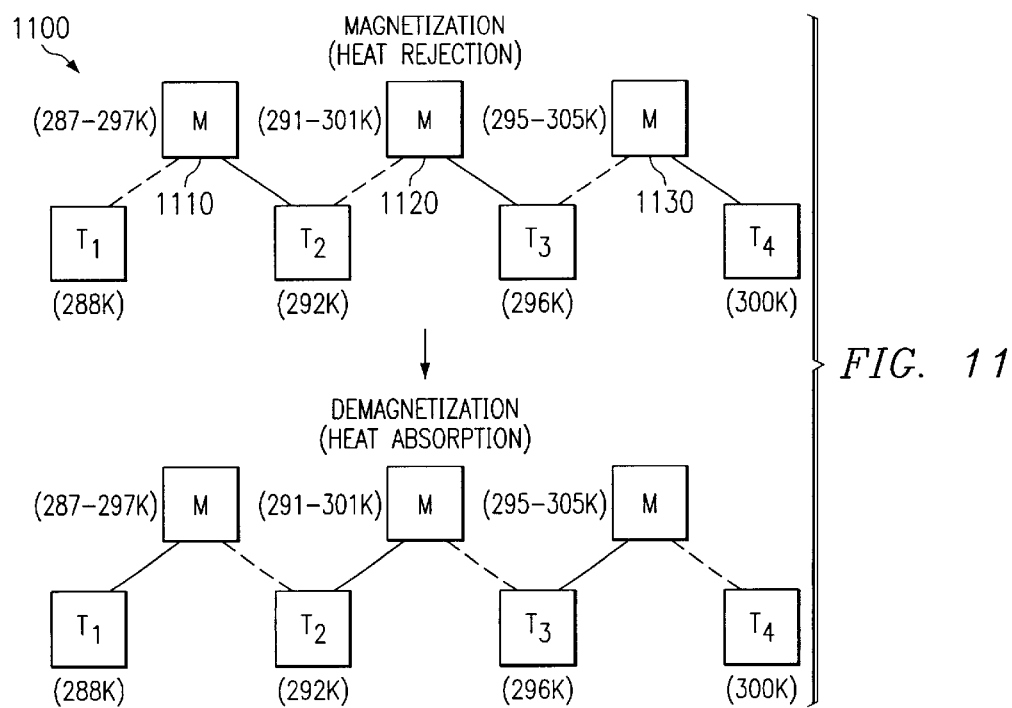
FIG. 11 is an exemplary diagram illustrating the phases in a cascaded multistage electromagnetic refrigeration system according to one embodiment of the present invention.

As noted previously, the present invention provides a mechanically simplified magnetic refrigeration system that is more easily adapted to cascaded configurations than known magnetic refrigeration systems. FIG. 11 illustrates the manner by which the embodiments of the present invention may be cascaded to provide adequate temperature range cooling for most applications.

As discussed previously, individual magnetocaloric elements typically provide a temperature reduction of around 3 degrees Kelvin per Tesla of magnetic field when operating around room temperature. Thus, in order to get adequate refrigeration temperature differentials, e.g., 20–30 degrees Kelvin, these magnetocaloric elements of the refrigeration systems need to be cascaded. The present invention provides mechanically simple embodiments which lend themselves to such cascading.

As shown in FIG. 11, three magnetic refrigeration systems 1110–1130, according to one or more of the embodiments described previously, are provided in a cascaded system 1100. While only three magnetocaloric type magnetic refrigeration system stages are shown, it should be appreciated that the cascading of these systems may involve any number of stages depending on the magnitude of the temperature difference desired. In addition, exemplary temperatures and temperature ranges are shown in FIG. 11 for illustrative purposes. The present invention should not be interpreted as being limited to these temperatures or temperature ranges. Any temperatures and temperature ranges may be used without departing from the spirit and scope of the present invention.

As illustrated in FIG. 11, the hot end of magnetic refrigeration system 1110 is the $T_2$ thermal sink which is the cold side, or thermal source, of magnetic refrigeration system 1120. In the depicted illustration, the temperature $T_2$ averages about 292 Kelvin. The cold end for magnetic refrigeration system 1110 is $T_1$ which, in the illustrated example, averages about 288 Kelvin. Similarly, the hot end for magnetic refrigeration system 1120 is $T_3$ which is the cold end for magnetic refrigeration system 1130. In the illustrated example, $T_3$ averages about 296 Kelvin.

The hot end for magnetic refrigeration system 1130 is $T_4$ which is illustrated to be the ambient temperature of around 300 Kelvin. The magnetocaloric material elements (denoted as "M") have operating temperatures of 287–297 Kelvin, 291–301 Kelvin and 295–395 Kelvin, respectively.

During magnetization, current is passed through the switches such that the switches (shown as dotted lines) are set to an "off" state. Thus, the magnetic refrigeration systems 1110–1130 reject heat to the reservoirs $T_2$, $T_3$ and $T_4$, respectively. For example, during magnetization, the magnetocaloric material element for magnetic refrigeration system 1110 heats up to 297 Kelvin. Heat is then rejected to thermal sink $T_2$ such that the magnetocaloric material element and the thermal sink $T_2$ equalize to a nominal temperature of 292 Kelvin.

During heat absorption, current is passed through the switches represented by dotted lines to place them in an "off" state. As a result, heat is absorbed from thermal sources T1, T2 and T3.

For example, magnetocaloric material element M of magnetic refrigeration system 1110 cools to a temperature of 287 Kelvin when the magnetic field is removed. As a result, heat flows from the thermal source T1 to the magnetocaloric material element to thereby equalize the temperature to be approximately 288 Kelvin.

Figure 12:
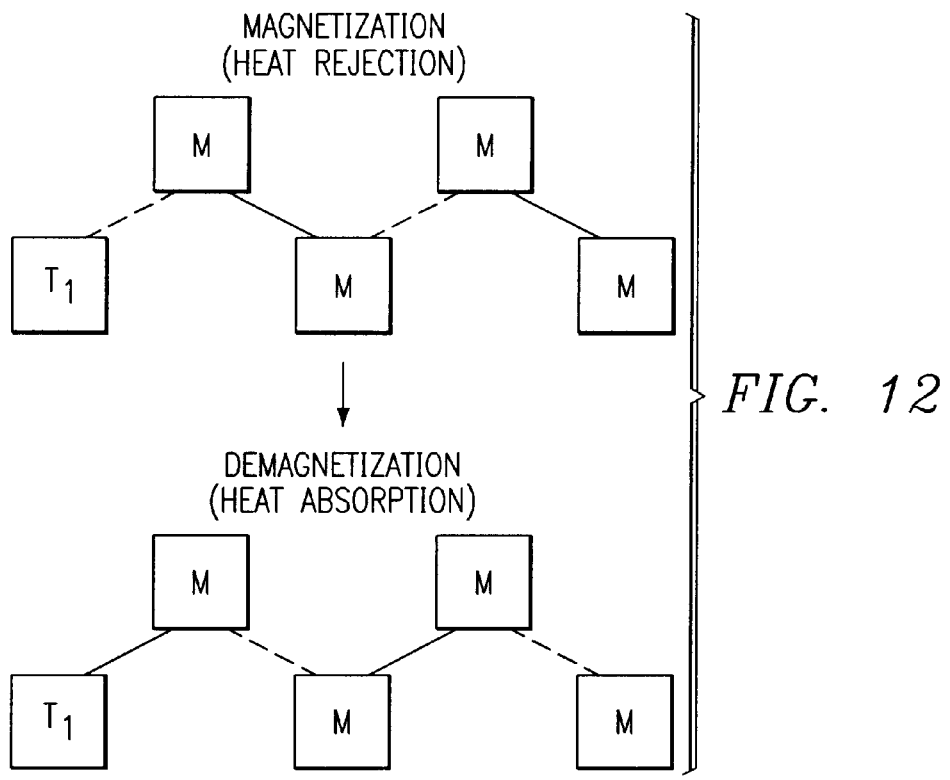
FIG. 12 is an exemplary diagram illustrating a cascaded multistage electromagnetic refrigeration system according to an alternative embodiment in which intermediate heat sinks are replaced by magnetocaloric materials of a next stage in the cascaded system.

In the embodiment shown in FIG. 11, four thermal sinks/sources are present. However it may be desirable to eliminate the intermediate thermal sinks/sources in order to obtain a more simplified cascaded system. FIG. 12 illustrates an alternative embodiment in which the magnetocaloric material elements of additional stages are utilized as heat sinks/sources in the previous stages of the cascaded system. The operation of this embodiment is similar to that of FIG. 11 with the exception that heat is not rejected from or absorbed from a separate thermal sink/source.

Figure 13A:
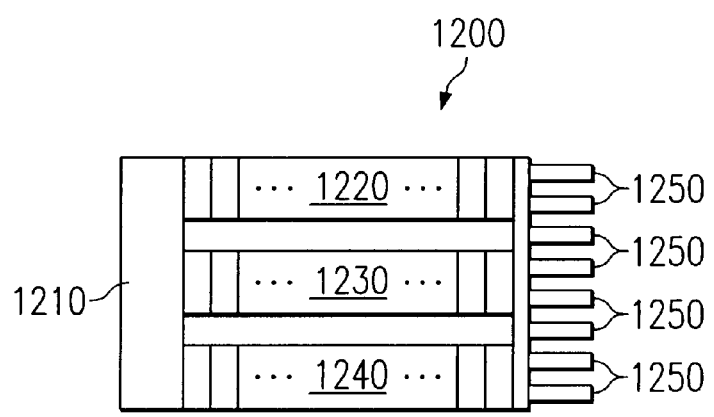
FIGS. 13A and 13B are exemplary diagrams illustrating configurations of a cascaded magnetic refrigeration system.
Figure 13B:
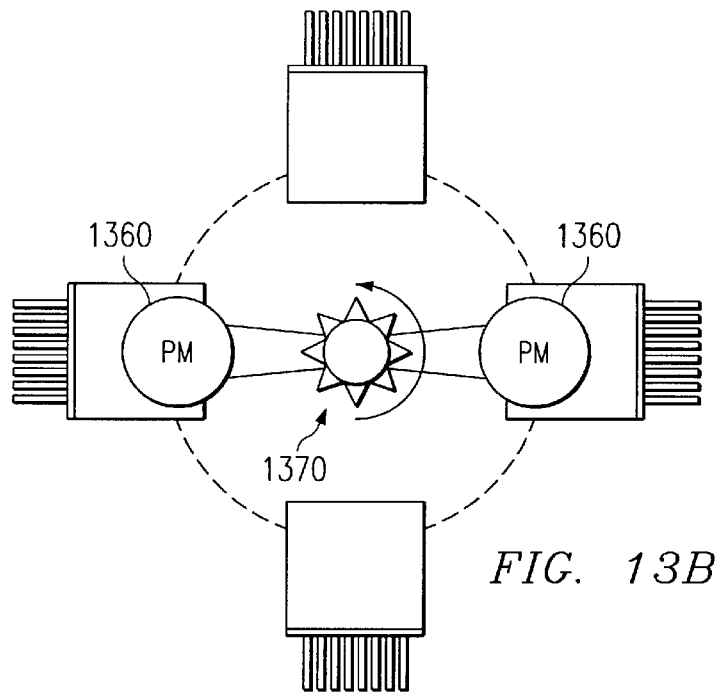

It should be appreciated that the cascading of magnetic refrigeration systems may take any number of different configurations and orientations without departing from the spirit and scope of the present invention. FIGS. 13A and 13B illustrate two exemplary embodiments of cascaded magnetic refrigeration systems in accordance with the present invention.

FIG. 13 illustrates a parallel configured magnetic refrigeration system. A cold end 1210 is refrigerated by multiple parallel positioned stacks of cascaded magnetic refrigeration stages. Each stage in each stack 1220–1240 makes use of a magnetic refrigeration system according to one or more of the embodiments previously described. A heat dissipater 1250 is provided on the opposite side of the cascaded and paralleled magnetic refrigeration system for rejection of heat to the ambient. The heat dissipater 1250 may be, for example, heat rejection fins, or the like, that are used to radiate heat into the ambient environment.

FIG. 12B illustrates a parallel magnetic refrigeration system in which a pair of permanent magnets 1360 rotate about an axis of a motor 13700. The stages of the parallel magnetic refrigeration system are placed around the circumference of the circle representing the path of the permanent magnets 1370. With this embodiment, each stage may operate to generate the same temperature differentials and thereby, provide a larger area of cooling.

It should be appreciated that other configurations and orientations of the elements shown in FIGS. 13A and 13B may be used without departing from the spirit and scope of the present invention. In addition, the embodiments of FIGS. 13A and 13B may be combined to provide even greater cooling capacity.

It should be appreciated that the cascaded and parallel systems described above may be used with the microelectromechanical switches described in FIG. 2. Thus, the cascaded and parallel systems of the present invention are not limited to embodiments in which thermoelectric switches are utilized. Rather, any embodiment or combination of embodiments described herein, or modified versions of these embodiments, may be combined into a cascaded or parallel system without departing from the spirit and scope of the present invention.

Figure 14:
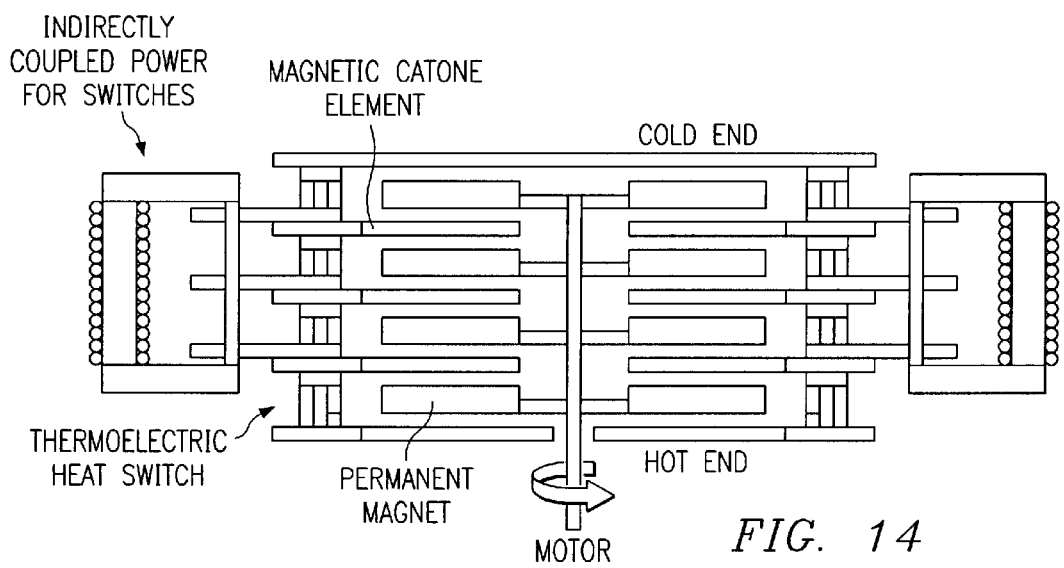
FIG. 14 is an exemplary diagram illustrating a motor driven cascaded parallel electromagnetic refrigeration system in accordance with one embodiment of the present invention.

FIG. 14 schematically depicts a cascaded and parallel configured permanent magnet, motor driven, multi-stage magnetic refrigeration system with indirect coupling to power the thermoelectric switches. With the embodiment shown in FIG. 14, two indirectly coupled power sources are provided for the thermoelectric switches. A single motor drives a shaft that rotates the permanent magnets for each stage of the multi-stage magnetic refrigeration system. It should be appreciated that FIG. 14 is only illustrative and many modifications may be made to the configuration shown in FIG. 14 without departing from the spirit and scope of the present invention.

Thus, the present invention provides mechanisms for improving the operation and reliability of magnetic refrigeration systems. With the present invention, much of the mechanical moving parts and complex fluid circulation systems of known magnetic refrigeration systems is eliminated thereby providing a simplified design having greater reliability. Moreover, the present invention provides magnetic refrigeration systems that lend themselves to cascading as a way to obtain greater temperature differentials.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A magnetic cooling system comprising:
   a magnetocaloric material; and
   at least one thermoelectric switch that is energized by direct electrical coupling, for switching between a heat rejection and heat absorption phase of a magnetic cooling cycle, wherein when the magnetocaloric material is heated by the presence of a magnetic field, the at least one thermoelectric switch operates to allow heat rejection from the magnetocaloric material to a heat sink, and wherein when the magnetic field is removed from the magnetocaloric material, the at least one thermoelectric switch operates to allow heat absorption from a heat source.

2. The magnetic cooling system of claim 1, wherein the at least one thermoelectric switch is a thermoelectric cooler.

3. The magnetic cooling system of claim 1, wherein the at least one thermoelectric switch comprises:
   a first thermoelectric switch positioned between a cold end and the magnetocaloric material;
   a second thermoelectric switch positioned between a hot end and the magnetocaloric material; and
   a third thermoelectric switch positioned between a hot end and the magnetocaloric material.

4. The magnetic cooling system of claim 3, wherein, during heat rejection, a current is passed through the first thermoelectric switch to cause approximately zero heat flow through the first thermoelectric switch.

5. The magnetic cooling system of claim 3, wherein, during heat absorption, a current is passed through the second and third thermoelectric switches.

6. The magnetic cooling system of claim 1, wherein the at least one thermoelectric switch has a thermal conductivity that conducts heat from a heat source to a heat sink in the absence of a current being passed through the thermoelectric switch.

7. The magnetic cooling system of claim 1, further comprising an electromagnet that generates the magnetic field to cause the magnetocaloric material to generate heat.

8. The magnetic cooling system of claim 7, wherein a current is sent to the at least one thermoelectric switch to change an operation of the thermoelectric switch, and wherein a control signal for magnetizing or demagnetizing the electromagnet is synchronized with the providing of the current.

9. The magnetic cooling system of claim 1, wherein the at least one thermoelectric switch includes one or more redundant thermoelectric switches provided such that the one or more redundant thermoelectric switches assumes the operation of a thermoelectric switch in the event of a failure of the thermoelectric switch.

10. The magnetic cooling system of claim 1, wherein a control system is programmed to provide a particular switching rate for the at least one thermoelectric switches.

11. The magnetic cooling system of claim 1, wherein the magnetic cooling system is part of a cascaded system having a plurality of magnetic cooling systems.

12. The magnetic cooling system of claim 11, wherein the cascaded system is a stacked cascaded system.

13. The magnetic cooling system of claim 11, wherein the system also comprises a parallel system.

14. The magnetic cooling system of claim 1, further comprising:
   at least one permanent magnet; and
   a mechanism for moving the permanent magnet into and out of functional proximity to the magnetocaloric material.

15. The magnetic cooling system of claim 14, wherein the mechanism for moving the permanent magnet into and out of functional proximity to the magnetocaloric material is a motor driven rotating mechanism.

16. The magnetic cooling system of claim 3, wherein a first leg of the third thermoelectric switch is coupled to a first leg of the first thermoelectric switch and a first leg of the second thermoelectric switch is coupled to a second leg of the first thermoelectric switch.

17. The magnetic cooling system of claim 16, wherein the first thermoelectric switch is operated by applying a first current through the first leg of the third thermoelectric switch and a second current through the first leg of the second thermoelectric switch.

18. The magnetic cooling system of claim 17, wherein the second current is of substantially equal magnitude as the first current.

19. The magnetic cooling system of claim 16, wherein heat flow through the second and third thermoelectric switches is blocked by introducing a third current into the first and the second legs of the third thermoelectric switch, and a fourth current into the first and second legs of the second thermoelectric switch.

20. The magnetic cooling system of claim 19, wherein the fourth current is of substantially equal magnitude as the third current.

21. A method of making a magnetic cooling system comprising:
   providing a magnetocaloric material; and
   providing at least one thermoelectric switch that is energized by direct electrical coupling, for switching between a heat rejection and heat absorption phase of a magnetic cooling cycle, wherein when the magnetocaloric material is heated by the presence of a magnetic field, the at least one thermoelectric switch operates to allow heat rejection from the magnetocaloric material to a heat sink, and wherein when the magnetic field is removed from the magnetocaloric material, the at least one thermoelectric switch operates to allow heat absorption from a heat source.

22. The method of claim 21, wherein the at least one thermoelectric switch is a thermoelectric cooler.

23. The method of claim 21, wherein providing the at least one thermoelectric switch comprises:

providing a first thermoelectric switch positioned between a cold end and the magnetocaloric material;

providing a second thermoelectric switch positioned between a hot end and the magnetocaloric material; and providing a third thermoelectric switch positioned between a hot end and the magnetocaloric material.

24. The method of claim 23, further comprising providing a current through the first thermoelectric switch to cause approximately zero heat flow through the first thermoelectric switch during heat rejection.

25. The method of claim 23, further comprising providing a current through the second and third thermoelectric switches during heat rejection.

26. The method of claim 21, wherein the at least one thermoelectric switch has a thermal conductivity that conducts heat from a heat source to a heat sink in the absence of a current being passed through the thermoelectric switch.

27. The method of claim 21, further comprising providing an electromagnet that generates the magnetic field to cause the magnetocaloric material to generate heat.

28. The method of claim 27, further comprising providing a current to the at least one thermoelectric switch to change an operation of the thermoelectric switch, and wherein a control signal for causing the electromagnet to either magnetize or demagnetize is synchronized with the providing of the current.

29. The method of claim 21, wherein providing the at least one thermoelectric switch includes providing one or more redundant thermoelectric switches provided such that the one or more redundant thermoelectric switches assumes the operation of a thermoelectric switch in the event of a failure of the thermoelectric switch.

30. The method of claim 21, further comprising providing a control system that is programmed to provide a particular switching rate for the at least one thermoelectric switches.

31. The method of claim 21, wherein the magnetic cooling system is provided as part of a cascaded system having a plurality of magnetic cooling systems.

32. The method of claim 31, wherein the cascaded system is a stacked cascaded system.

33. The method of claim 31, wherein the system also comprises a parallel system.

34. The method of claim 31, further comprising:

providing at least one permanent magnet; and providing a mechanism for moving the permanent magnet into and out of functional proximity to the magnetocaloric material.

35. The method of claim 34, wherein the mechanism for moving the permanent magnet into and out of functional proximity to the magnetocaloric material is a motor driven rotating mechanism.

36. The method of claim 23, wherein a first leg of the third thermoelectric switch is coupled to a first leg of the first thermoelectric switch and a first leg of the second thermoelectric switch is coupled to a second leg of the first thermoelectric switch.

37. The method of claim 36, wherein the first thermoelectric switch is operated by applying a first current through the first leg of the third thermoelectric switch and a second current through the first leg of the second thermoelectric switch.

38. The method of claim 37, wherein the second current is of substantially equal magnitude as the first current.

39. The method of claim 36, wherein heat flow through the second and third thermoelectric switches is blocked by introducing a third current into the first and the second legs of the third thermoelectric switch, and a fourth current into the first and second legs of the second thermoelectric switch.

40. The method of claim 39, wherein the fourth current is of substantially equal magnitude as the third current.

41. A method of cooling in a magnetic refrigeration system, comprising:

applying a magnetic field to a magnetocaloric material;

applying a current to a first thermoelectric switch to block heat flow through the first thermoelectric switch;

removing the magnetic field from the magnetocaloric material;

applying a current to a second and a third thermoelectric switch; and stopping the application of the current to the first thermoelectric switch.

42. The method of claim 41, wherein the application of the current to the first thermoelectric switch is synchronized with an application of a current to the electromagnet, and wherein the application of the current to the second and third thermoelectric switches is synchronized with a stopping of the current from the electromagnet.

43. The method of claim 41, wherein the magnetic refrigeration system is part of a cascaded system having a plurality of magnetic refrigeration systems and wherein the method is repeated for each magnetic refrigeration system in the cascaded system.

44. The method of claim 43, wherein the cascaded system is a stacked cascaded system.

45. The method of claim 43, wherein the system also comprises a parallel system.

46. The method of claim 41, wherein the magnetic field is applied using at least one permanent magnet and a mechanism for moving the permanent magnet into and out of functional proximity to the magnetocaloric material.

47. The method of claim 46, wherein the mechanism for moving the permanent magnet into and out of functional proximity to the magnetocaloric material is a motor driven rotating mechanism.

* * * * *